United States Patent
Hsia et al.

(10) Patent No.: US 6,495,408 B1
(45) Date of Patent: Dec. 17, 2002

(54) LOCAL INTERCONNECTION PROCESS FOR PREVENTING DOPANT CROSS DIFFUSION IN SHARED GATE ELECTRODES

(75) Inventors: Shouli Hsia, San Jose, CA (US); Jiunn-Yann Tsai, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/477,170

(22) Filed: Jan. 4, 2000

Related U.S. Application Data

(62) Division of application No. 09/020,029, filed on Feb. 6, 1998, now Pat. No. 6,034,401.

(51) Int. Cl.$^7$ .................... H01L 21/8238; H01L 29/76
(52) U.S. Cl. .................. 438/214; 438/598; 257/369
(58) Field of Search .................. 438/279, 280, 438/286, 287, 289, 301, 214, 215, 199, 598, 601; 257/374, 388, 369, 371, 377, 751

(56) References Cited

U.S. PATENT DOCUMENTS

| | | | |
|---|---|---|---|
| 4,477,310 A | 10/1984 | Park et al. | |
| 5,585,659 A | 12/1996 | Kobayashi et al. | |
| 5,717,254 A | * 2/1998 | Hashimoto | 257/773 |
| 6,180,996 B1 | * 1/2001 | Onoda et al. | 257/536 |

FOREIGN PATENT DOCUMENTS

| | | |
|---|---|---|
| JP | 1-265542 | 10/1989 |
| JP | 5-251649 | 9/1993 |

OTHER PUBLICATIONS

F.C. Shone, et al. *Tech. Dig. IEDM*, 407, 1985.
R. Liu et al., *Tech Dig. IEDM*, 58, 1986.
Q.F. Wang et al. *IEEE Trans. Elec. Dev.*, 2486, 1992.
J.Y. Tsai et al. *MRS Symp.*, 245, 1995.
C. Chu, et al. *Tech. Dig. IEDM*, 245, 1990.

* cited by examiner

*Primary Examiner*—Matthew Smith
*Assistant Examiner*—Calvin Lee
(74) *Attorney, Agent, or Firm*—Beyer, Weaver & Thomas, LLP

(57) ABSTRACT

Disclosed is a process of electrically coupling the gate electrodes of an N-type transistor and a P-type transistor without causing substantial cross diffusion of P-type dopants into the N-type gate electrode and N-type dopants into the P-type gate electrode. This is possible because some or all annealing and diffusion steps are performed while the N-type and P-type gate electrodes are physically isolated from one another. Also disclosed is a Silicide as Diffusion Source process in which dopant atoms implanted in silicide regions diffuses out of the silicide regions and into the substrate to form source and drain diffusions. During this diffusion step adjacent N-type and P-type gate electrodes remain unconnected to prevent cross diffusion. Then, these two electrodes are electrically connected by a local interconnect. The local interconnection is a conductive path formed at about the level of the polysilicon (i.e., below a first metallization layer and above a substrate) and between two adjacent gate electrodes. In one case it is a tungsten plug formed in the space between an N-type polysilicon gate and a P-type polysilicon gate. In another case, it is a titanium nitride layer connecting the N-type and P-type polysilicon gates.

21 Claims, 11 Drawing Sheets

LOCAL INTERCONNECTION PROCESS FOR PREVENTING DOPANT CROSS DIFFUSION IN SHARED GATE ELECTRODES

This is a Divisional application of prior application Ser. No. 09/020,029 filed on Feb. 6, 1998 now U.S. Pat. No. 6,034,401 which designated the United States, the disclosure of which is incorporated herein by reference.

BACKGROUND OF THE INVENTION

1. The Field of the Invention

The present invention relates to semiconductor devices and methods for their construction. More particularly, the present invention generally relates to forming a local interconnect between adjacent transistors of a semiconductor device. More specifically, the present invention relates to processes for forming a local interconnect that provides an electrical connection between polysilicon gate electrodes of adjacent N-type and P-type transistors in a CMOS device. The invention also relates to semiconductor devices formed by employing such local interconnect processes.

2. The Background Art

Low resistance, shallow junction formation is one of the major challenges for scaling of MOS devices to submicron dimensions. Silicide layers are conventionally formed over source, drain, and gate regions to form low resistance contacts. The silicide is typically formed over the source or drain regions on the single crystal silicon substrate or on the polysilicon gate by reacting the silicon with a refractory metal such as titanium, cobalt, nickel and tungsten. In a typical commercial process, the silicide is formed after the source and drain regions have been implanted and annealed.

A number of different methods exist to implement the SALICIDE process. A conventional process is illustrated in FIGS. 1, 2, 3 and 4. FIG. 1 is a cross sectional view of a partially fabricated transistor after up to the spacer etching. The partially fabricated device includes polysilicon gate electrode 8 and gate oxide 4 which are straddled by spacers 6a and 6b on silicon substrate 2. Implanted P-type or N-type source and drain "tip region" diffusions 7 and 9 have also been formed. In some processes these are referred to as "lightly doped drain" regions.

FIG. 2 is a cross sectional view of a partially fabricated transistor after source and drain diffusion formation and ion implantation. P$^+$or N$^+$ion implantation may take place during the formation of source region 10 and drain region 12. In some situations source and drain regions will be formed in a single implant step. In many conventional fabrication schemes, well known to those skilled in the art, the source and drain regions are formed in a two step process, with implants being formed before and after spacer formation (as shown in FIGS. 1 and 2).

FIG. 3 is a cross sectional view of a partially fabricated transistor after dopant activation anneal. Typically, a high temperature annealing step is required to remove ion-implantation induced damage to the silicon substrate. During this high temperature annealing some limited diffusion of dopant through the silicon substrate 2 also occurs.

FIG. 4 is a cross sectional view of a partially fabricated transistor after silicidation. Silicide layers 14, 18 and 16 have been formed over source 10, polysilicon gate electrode 8 and drain 12 respectively. Thus, in typical conventional processes the silicide layer is formed after the source and drain regions have been implanted and annealed.

A number of problems with the conventional process have become increasingly critical with decreasing device size. Ion implantation induced damage of the silicon substrate requires high temperature annealing that causes dopant redistribution which significantly degrades the performance of smaller devices. More importantly, as device size decreases the thickness of the silicide layer must correspondingly decrease to preserve p-n junction integrity. Unfortunately, precise control of silicide layer thickness is often unattainable. Silicide layers must not grow beyond the edge of the source or drain region in the substrate. A silicide layer that grows beyond the edge of the source or drain region could become large enough to consume most or all of the source and drain regions thus destroying the p-n junction necessary for proper device functioning.

Silicide layer thickness has not been a significant problem in semiconductor fabrication until device sizes decreased below 0.25 $\mu$m. For example, in a 0.18 $\mu$m transistor (i.e., the channel region of an MOS transistor is 0.18 microns) the depth of the source and drain diffusions is only about 0.1 $\mu$m. In such devices, the depth of the silicide layer must remain below about 300 Å, a thickness that can be exceedingly difficult to reproducibly attain.

The Silicide as Diffusion Source (SADS) process offers a solution to the problems associated with the conventional process described above (F. C. Shone et al., *Tech. Dig. IEDM*, 407, 1985; R. Liu et al., *Tech Dig. IEDM*, 58, 1986; Q. F. Wang et al., *IEEE Trans. Elec. Dev.*, 2486, 1992; J. Y. Tsai et al., *MRS Symp.*, 245, 1995; C. Chu et al., *Tech. Dig. IEDM*, 245, 1990). In the SADS process, which is depicted in FIGS. 7A, 8A, 9A and 10A, silicide is formed on the source, drain, and polysilicon gate regions prior to formation of source and drain diffusions (See FIG. 8A). Then dopant atoms are implanted into the silicide at the locations where the source and drain diffusions are to be formed and the silicide located over the polysilicon gate electrode. (See FIG. 9A). After annealing, the dopant atoms residing in the silicide layers over the location of the incipient source and drain diffusions, diffuse into the silicon substrate to form source and drain diffusion regions (See FIG. 10A). Similarly, the dopant atoms residing in the silicide over the polysilicon gate electrode diffuse into the gate to form a doped polysilicon gate region (See FIG. 10A).

Formation of the source and drain diffusion after silicide formation ensures that the p-n junction is not consumed by the silicide layer since these diffusion regions grow away from the silicide layer. Furthermore, ion implantation directly into the silicide layer ensures that any resultant damage is largely confined within the silicide layer which is typically annealed at much lower temperatures than the silicon substrate. Therefore, dopant redistribution during annealing is not a significant problem when SADS process is used.

However, while the SADS process initially appeared promising, it has not become a viable commercial process because of at least one significant difficulty. In CMOS processes, N-type and P-type transistors are commonly coupled via a common gate input. Thus, adjacent N-type and P-type transistors typically share a polysilicon strip as their gate electrodes. As shown in FIG. 5 (top view of a partially fabricated CMOS structure) a common gate strip 5 is shared by an N-type transistor having source and drain diffusions 1a and 1b and a P-type transistor having source and drain diffusions 3a and 3b. In P-type devices, the gate electrode is typically doped with a P-type dopant such as boron. In N-type devices, the opposite is true; the gate electrode is doped with an N-type dopants such as phosphorus or arsenic.

The annealing step employed to form the source and drain regions in the SADS process also causes the N-type and P-type dopants in polysilicon gate strip 5 to laterally diffuse as shown. This is especially problematic because dopant atoms have relatively high diffusion coefficients in polysilicon. Therefore, during the annealing step N-type dopants rapidly diffuse into the PMOS gate electrode and P-type dopants rapidly diffuse into NMOS gate electrode. An N-type device with substantial concentrations of P-type dopants in its gate electrode cannot function properly. Similarly, a P-type device with substantial concentrations of N-type dopants in its gate electrode also cannot function properly. Therefore, the SADS process has not been found acceptable for commercial CMOS applications.

In any event it has become apparent that as device size shrinks improved methods for low resistance, shallow junctions are necessary. What is needed therefore is a process which solves the problem of dopant cross diffusion which occurs in polysilicon gates of CMOS devices when using the SADS process to form p-n junctions.

SUMMARY OF THE INVENTION

The present invention addresses this need by performing some or all annealing and diffusion steps while the two gate electrodes that are to be electrically connected are physically isolated from one another. Thus, the possibility of dopant cross diffusion across a common polysilicon strip is avoided. A local interconnection provides the necessary electrical connection between the two gate electrodes. The local interconnection is a conductive path formed at about the level of the polysilicon (i.e., below a first metallization layer and above a substrate) and between two adjacent gate electrodes. Some specific examples of local interconnections will be described below. In one case it is a tungsten plug formed in the space between an N-type polysilicon gate electrode and a P-type polysilicon gate electrode. In another case, a titanium nitride layer connects the N-type and P-type polysilicon gate electrodes.

One aspect of the invention provides a method for forming a CMOS structure having a first transistor coupled to a second transistor by a common gate contact on a partially fabricated electronic device. The method may be characterized as including the following sequence: (a) forming a first gate electrode on the first transistor and a second gate electrode on the second transistor; (b) providing dopant ions of a first conductivity to the first gate electrode and dopant ions of a second conductivity to the second gate electrode; and (c) forming a local interconnection electrically connecting the first gate electrode and the second gate electrode. As mentioned, the local interconnection is provided beneath a first metallization layer. In addition, it should retard diffusion of dopant atoms between the first and second gate electrodes during subsequent process steps.

Preferably, the first and second gate electrodes are formed as physically unconnected polysilicon structures by appropriately patterning a polysilicon layer, Typically, a step of annealing the CMOS structure is performed before forming the local interconnection. Because the two gate electrodes are physically unconnected during this anneal, dopant atoms will not diffuse between the first gate electrode and the second gate electrode.

In a preferred aspect of the invention, the above method is applied within a SADS process. In this aspect, the invention may be characterized as the following sequence: (a) patterning a polysilicon layer to provide a first gate electrode over a first transistor and a second gate electrode over a second transistor (preferably these gate electrodes are physically unconnected at this point); (b) forming a first silicide layer over first source and drain regions of the first transistor and a second silicide layer over second source and drain regions of the second transistor; (c) implanting dopant ions of a first conductivity into the first silicide layer and of a second conductivity into the second silicide layer; and (d) annealing to provide first source and drain diffusions that extend beyond the first silicide layer and second source and drain diffusions that extend beyond the second silicide layer without dopant ion diffusion between the first gate electrode and the second gate electrode; and (e) forming a local interconnection electrically connecting the first gate electrode and the second gate electrode.

As mentioned, SADS processes are particularly beneficial when forming devices of very small dimensions. Preferably, the source and drain diffusions are not more than about 0.1 μm thick and the silicide layers are not more than about 30 nm thick.

Conventional materials may be employed in the processes of this invention. For example, the silicide layers preferably include at least one of $CoSi_2$, $TiSi_2$, $NiSi_2$ and $WSi_2$. The local interconnection may include titanium nitride, tungsten, aluminum, copper, titanium silicide, tungsten-nickel, titanium, nickel silicide or other suitable conductive material.

Yet another aspect of the invention provides a semiconductor device that may be characterized as including the following features: (a) a first transistor with a first gate electrode; (b) a second transistor with a second gate electrode; and (c) a local interconnection electrically coupling the first gate electrode to the second gate electrode. To be particularly useful, the first and second transistors should be of different types. For example, the first transistor may be an N-type transistor while the second transistor is a P-type transistor. Such N-type and P-type transistors coupled through their gate electrodes often form at least a portion of an inverter circuit.

Preferably, the CMOS structure will include thin silicide layers (e.g., not more than about 30 nm thick) over the source and drain diffusions of the two transistors. Thus, even with very thin source and drain diffusions (e.g., not more than about 0.1 μm thick), source and drain diffusions will extend beyond the silicide layers. Such dimensions will typically be encountered in transistors having channel dimensions of less than about 0.2 μm.

The local interconnects in the CMOS structures of this invention preferably have the structures described above with regard to the method aspects of this invention. It is also worth noting that the local interconnects are preferably formed on a trench type transistor isolation region between the first and second transistors.

These and other features and advantages of the invention will be described in more detail below with reference to the following drawings.

DESCRIPTION OF SPECIFIC EMBODIMENTS

A preferred embodiment of the present invention is now described with reference to the figures where like reference numbers indicate identical or functionally similar elements. The disclosure illustrates a few embodiments of the invention, and in particular, the local interconnect. It should be recognized that the invention may encompass embodiments beyond those specifically disclosed herein.

Figure 1:
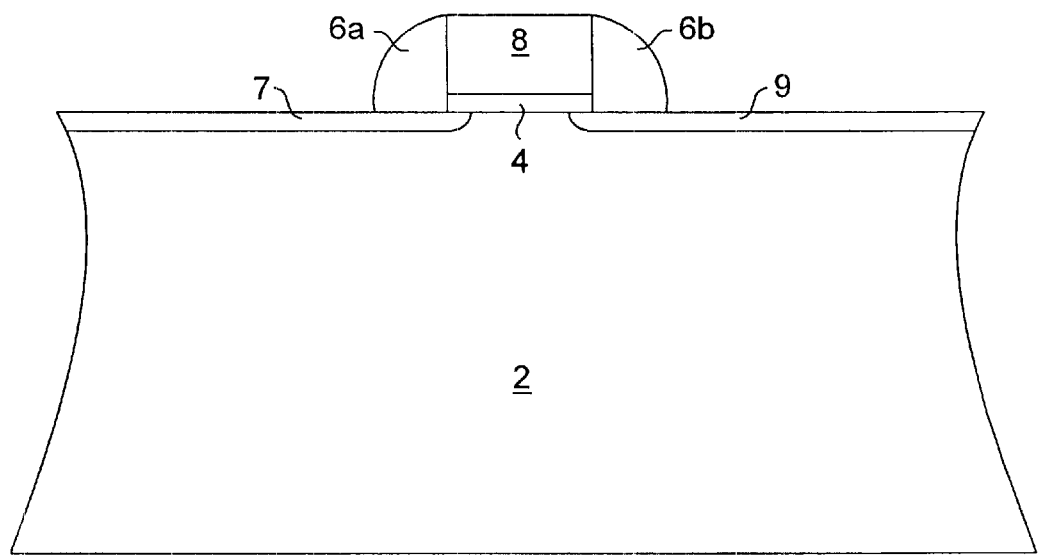
FIG. 1 is a cross sectional view of a partially fabricated transistor after up to the spacer etching in accordance with a conventional process.
Figure 2:
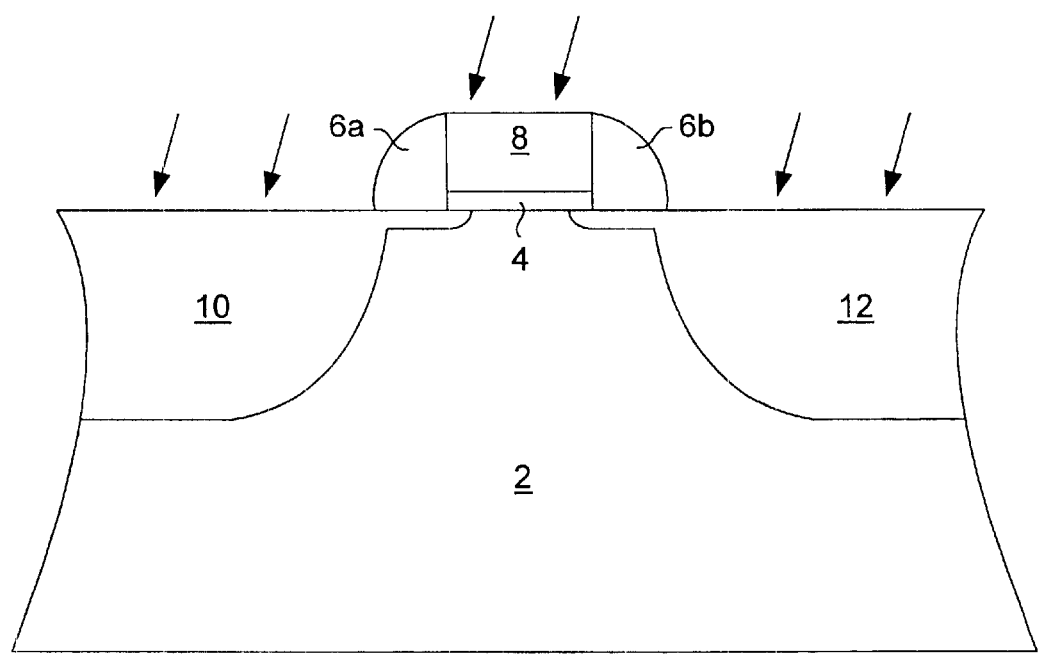
FIG. 2 is a cross sectional view of a partially fabricated transistor at source/drain ion implantation in accordance with a conventional process.
Figure 3:
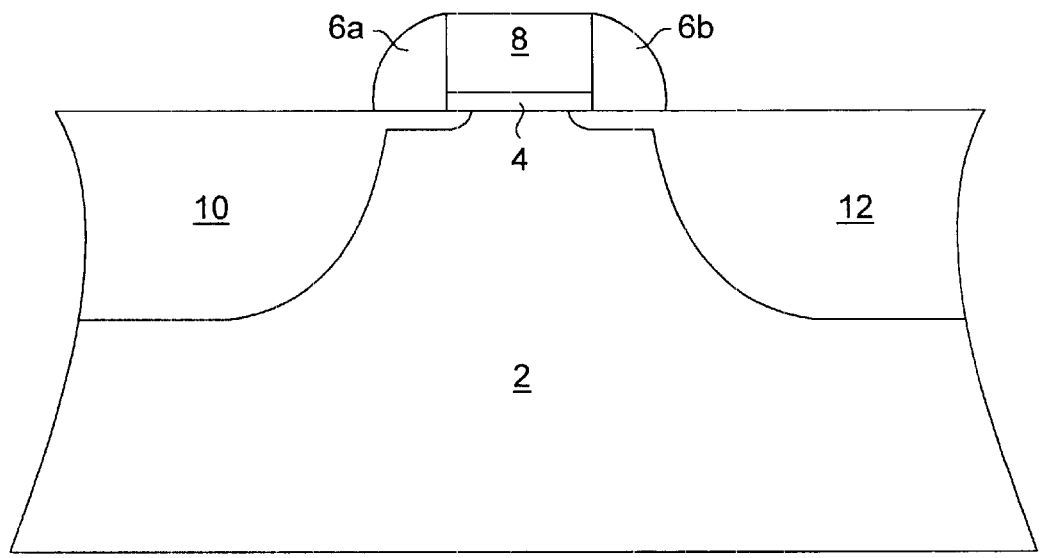
FIG. 3 is a cross sectional view of a partially fabricated transistor after dopant activation and annealing in accordance with a conventional process.
Figure 4:
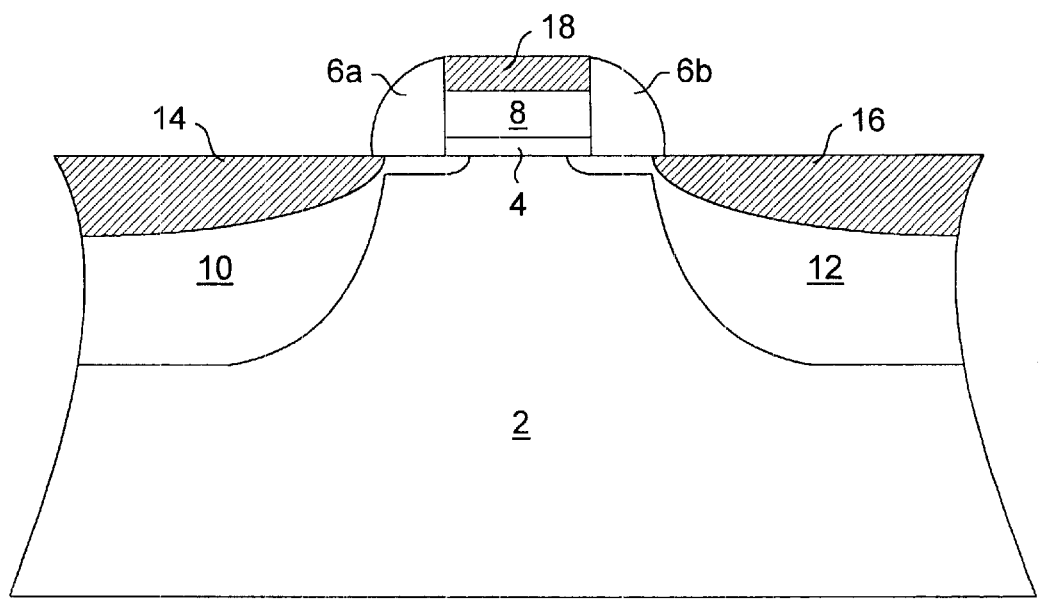
FIG. 4 is a cross sectional view of a partially fabricated transistor after silicidation in accordance with a conventional process.
Figure 5:
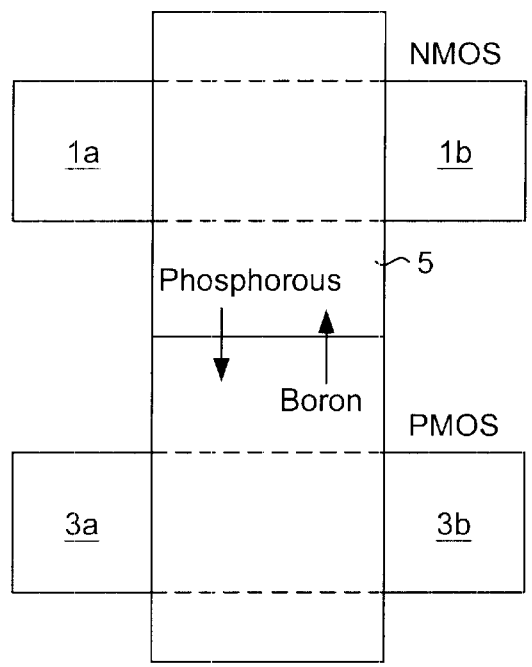
FIG. 5 is a top view of a NMOS transistor coupled to a PMOS transistor where the polysilicon gate electrodes are connected by a common polysilicon strip.
Figure 6A:
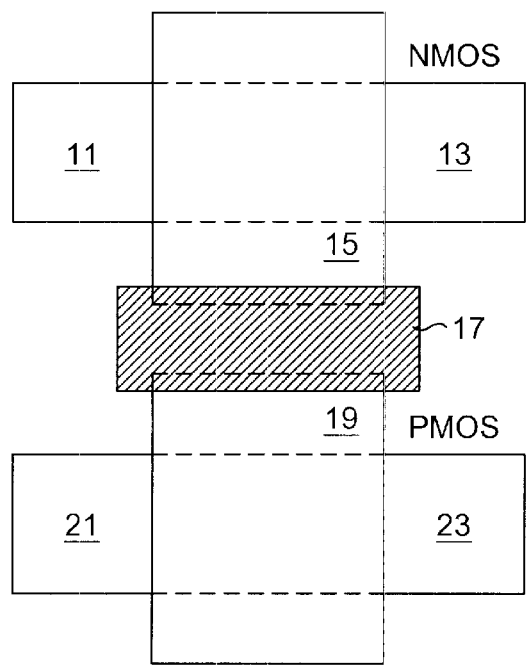
FIG. 6A is a top view of a NMOS transistor coupled to a PMOS transistor where the polysilicon gate electrodes are electrically connected by a local interconnect.
Figure 6B:
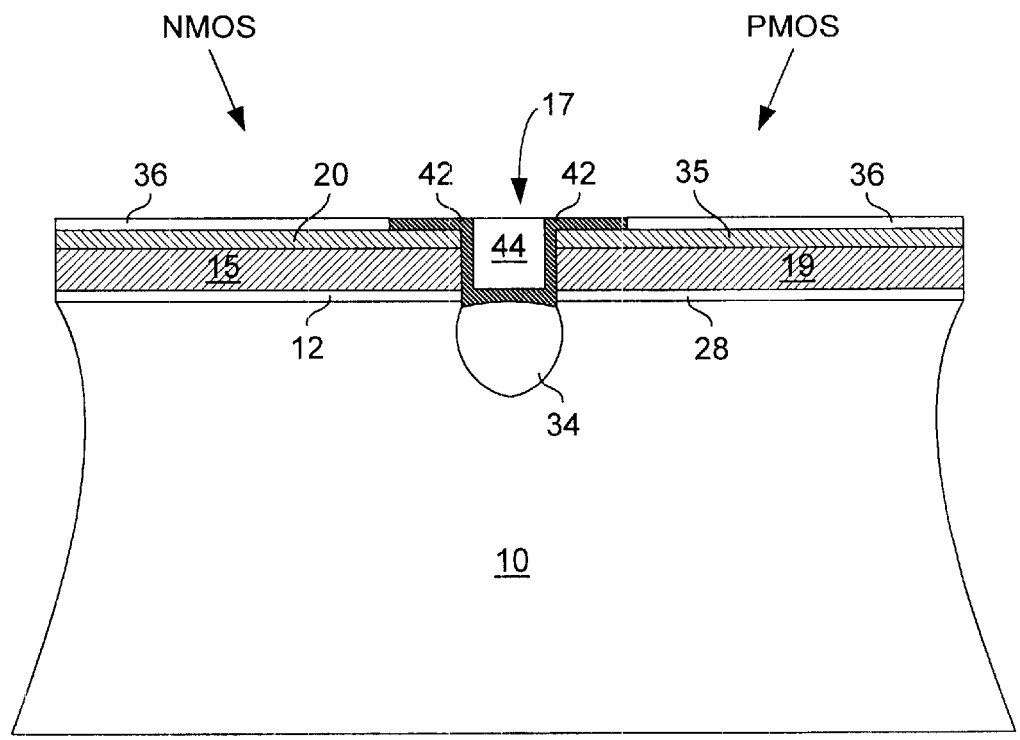
FIG. 6B is a cross sectional view of a NMOS transistor coupled to a PMOS transistor where the polysilicon gate electrodes are electrically by a local interconnect.

FIG. 6A depicts a top view of a CMOS device of the present invention, where polysilicon gate electrode 15 of a NMOS transistor (having source 11 and drain 13) is separated by local interconnect 17 from polysilicon gate electrode 19 of a PMOS transistor (having a source 21 and a drain 23). FIG. 6B is a cross sectional view across the channel regions of the adjacent NMOS and PMOS devices that illustrates the discrete layers that may be employed in one embodiment of local interconnect 17. A trench isolation region 34 (sometimes referred to as a "shallow trench isolation" or "STI oxide" region) physically separates but electrically connects the NMOS transistor on the left side of FIG. 6B from the PMOS transistor on the right side of FIG. 6B. The NMOS and PMOS transistors have gate oxide layers 12 and 28 formed on silicon substrate 10. The polysilicon gate electrode 15 of the NMOS transistor has been doped with N-type ions. Similarly, the polysilicon gate electrode 19 of the PMOS transistor has been doped with P-type ions. Covering the top portions of both polysilicon gate electrodes 15 and 19 are silicide regions 20 and 35, respectively. On top of these silicide regions is a layer of silicon oxynitride 36 that acts as both an etch stop layer for local interconnect processes and a transistor passivation layer. A titanium nitride layer 42 overlays silicide layers 20 and 35 and abuts the edges of the polysilicon gate electrodes 15 and 19 at the shallow trench isolation region. Notably, titanium nitride layer 42 conformally fills the contact hole above STI oxide 34 that is between the NMOS and PMOS transistors. A tungsten metal plug 44 completely fills the contact hole, thus improving conduction between NMOS and PMOS gate electrodes. The local interconnection structure depicted in FIG. 6B does not rely on either a continuous polysilicon strip contact to a first metallization layer to electrically connect adjacent polysilicon gate electrodes.

A specific preferred embodiment now will be described with reference to FIGS. 7A, 7B, 8A, 8B, 9A, 9B, 9C, 10A, 10B, 11, 12, 13, 14, 15 and 16. FIGS. 7A, 7B, 8A, 8B, 9A, 9B, 9C, 10A and 10B describe the SADS process. The described embodiment implements a modified SADS process of this invention. FIGS. 11–16 describe the subsequent formation of a local interconnect.

Figure 7A:
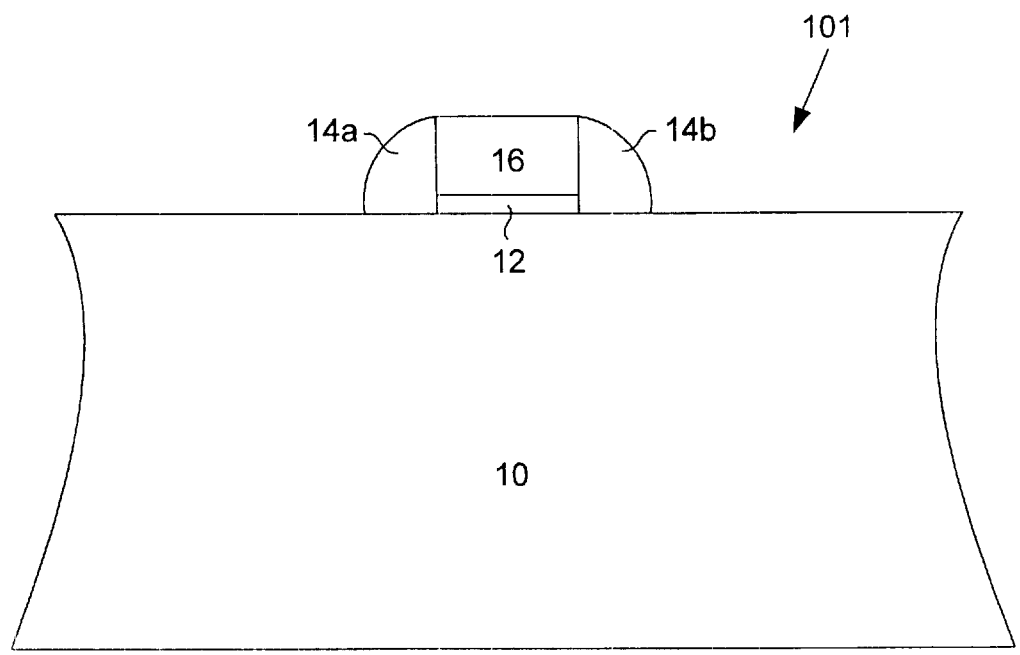
FIG. 7A is a cross sectional view of a partially fabricated transistor after up to the spacer etching.
Figure 7B:
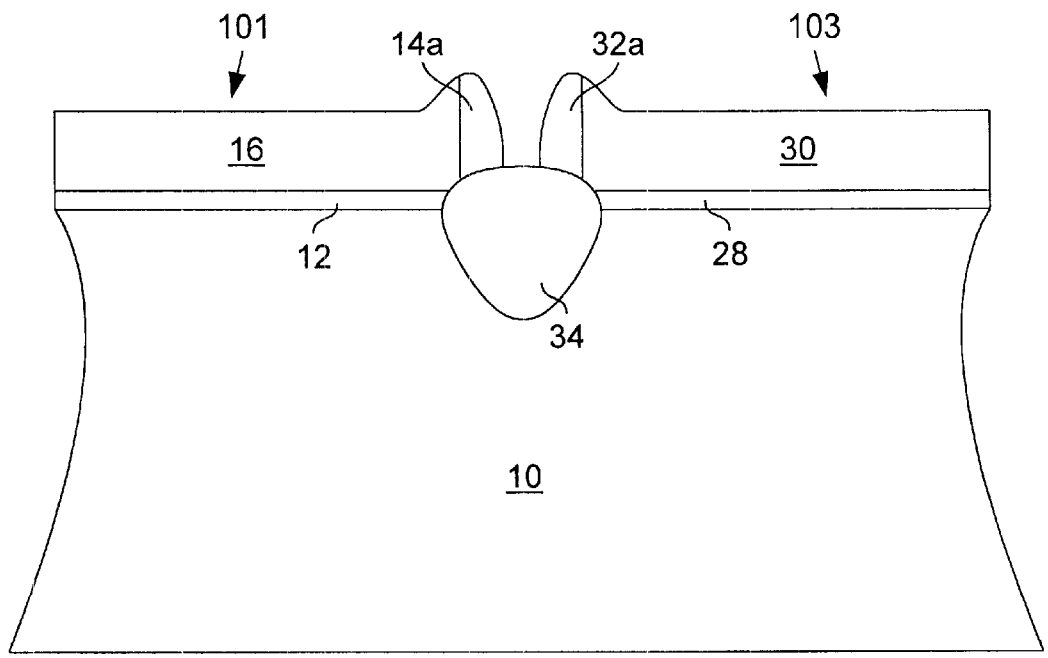
FIG. 7B is a cross sectional view across the channel regions of two adjacent partially fabricated transistors after up to spacer etching.

FIG. 7A is a cross sectional view of a partially fabricated transistor 101 after up to the spacer etching. The partially fabricated device includes polysilicon gate electrode 16 and gate oxide layer 12 which are straddled by spacers 14a and 14b on silicon substrate 10. FIG. 7B is a cross sectional view across the polysilicon gate electrodes and channel regions of two adjacent partially fabricated transistors after up to the spacer etching (i.e., at the same fabrication stage as in FIG. 7A). Transistor 101, depicted in FIG. 7A, is on the left side of FIG. 7B and is separated by silicon trench isolation oxide region 34 from a second device 103 illustrated on the right side of FIG. 7B. Partially fabricated transistor 103 includes polysilicon gate electrode 30, gate oxide layer 28, and spacer 32a all formed on silicon substrate 10. Polysilicon is deposited using conventional conditions on the gate oxide layer, preferably to a thickness of between about 1000 Å and about 3000 Å. The polysilicon is then patterned using methods well known to one skilled in the semiconductor arts to form polysilicon gate electrodes 16 and 30 over the two partially fabricated transistors.

In one preferred embodiment, the gate oxides are not more than about 50 Å thick, and more preferably between about 30 Å to about 40 Å thick. Preferably, the channel length is not more than about 0.5 µm and more preferably, not more than about 0.2 µm. In one specific embodiment, the channel length is about 0.18 µm. Typically, trench isolation regions such as STI oxide regions are particularly well suited to the new generation small dimension transistors, and may be preferable to the more conventional field oxide regions typically used in existing larger dimension devices.

Figure 8A:
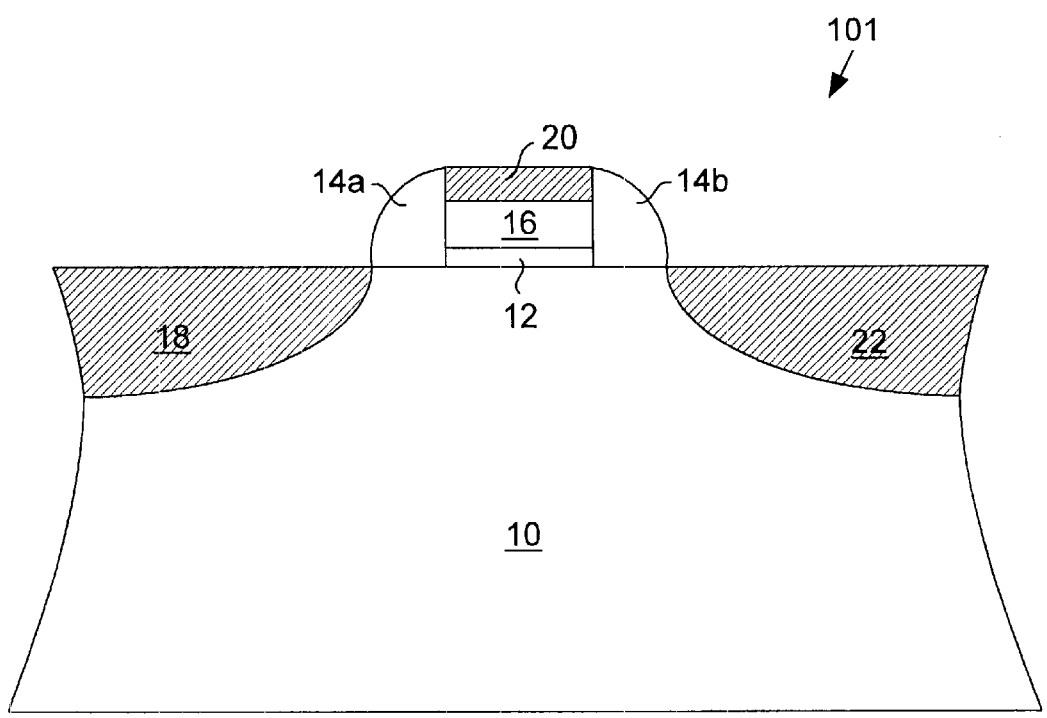
FIG. 8A is a cross sectional view of a partially fabricated transistor after silicidation.
Figure 8B:
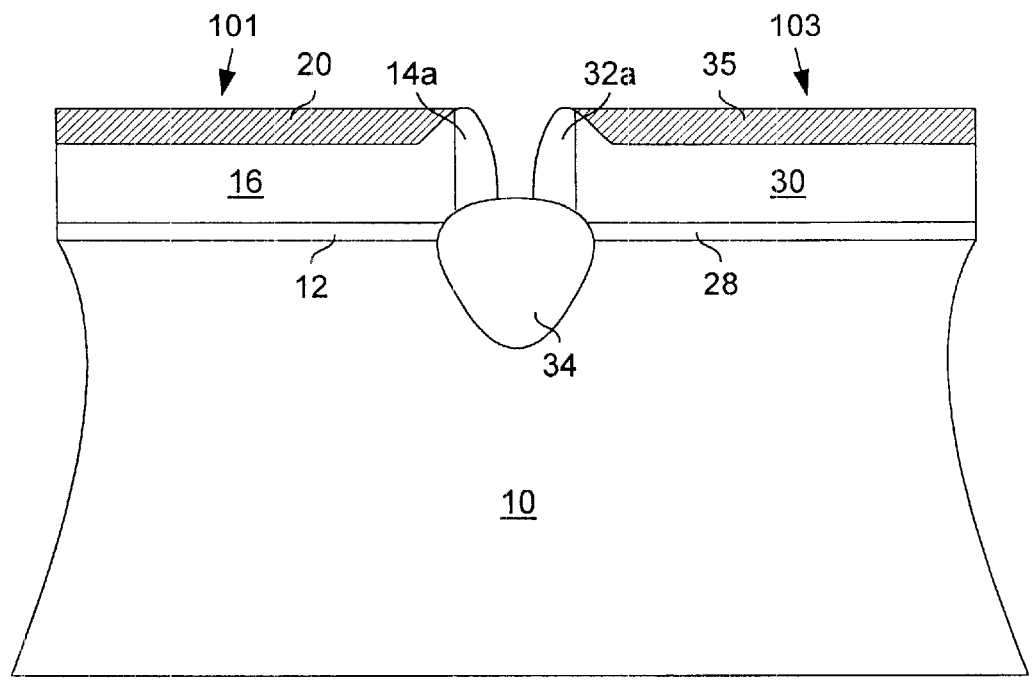
FIG. 8B is a cross sectional view across the channel regions of two adjacent partially fabricated transistors after silicidation.

FIG. 8A is a cross sectional view of transistor 101 of FIG. 7A after silicidation. Silicide regions 18, 20 and 22 have been formed over the source, drain and polysilicon gate electrode regions respectively. FIG. 8B is a cross sectional view of the channel region of adjacent partially fabricated transistors 101 and 103 of FIG. 7B after silicidation. Silicide layers 20 and 35 have been formed over polysilicon gate electrodes 16 and 30 respectively.

In devices of approximately 0.5 µm, the silicide layers are preferably between about 800 Å and about 1200 Å thick. In the emerging technology of sub-0.2 µm devices (e.g., 0.18 µm devices) silicide layers such as 18, 20, 22 and 35 are preferably between about 500 Å and about 200 Å thick. As a prelude to silicide formation, metals films of tungsten, cobalt, nickel or titanium are deposited on the silicon substrate by conventional means (e.g., evaporation using an electron beam evaporation system). The deposited metal then reacts with the underlying silicon to form silicide. In one specific embodiment a two stage annealing process drives the silicide formation in a rapid thermal anneal system. In this process, semiconductor wafers are initially annealed at temperatures between about 500° C. and about 600° C. for about 30 to about 60 seconds followed by a strip step to remove unreacted metal (e.g., a piranha etch). Then a high temperature anneal at between about 700° C. to about 800° C. is performed for about 30 to about 90 seconds to reduce silicide resistivity.

Figure 9A:
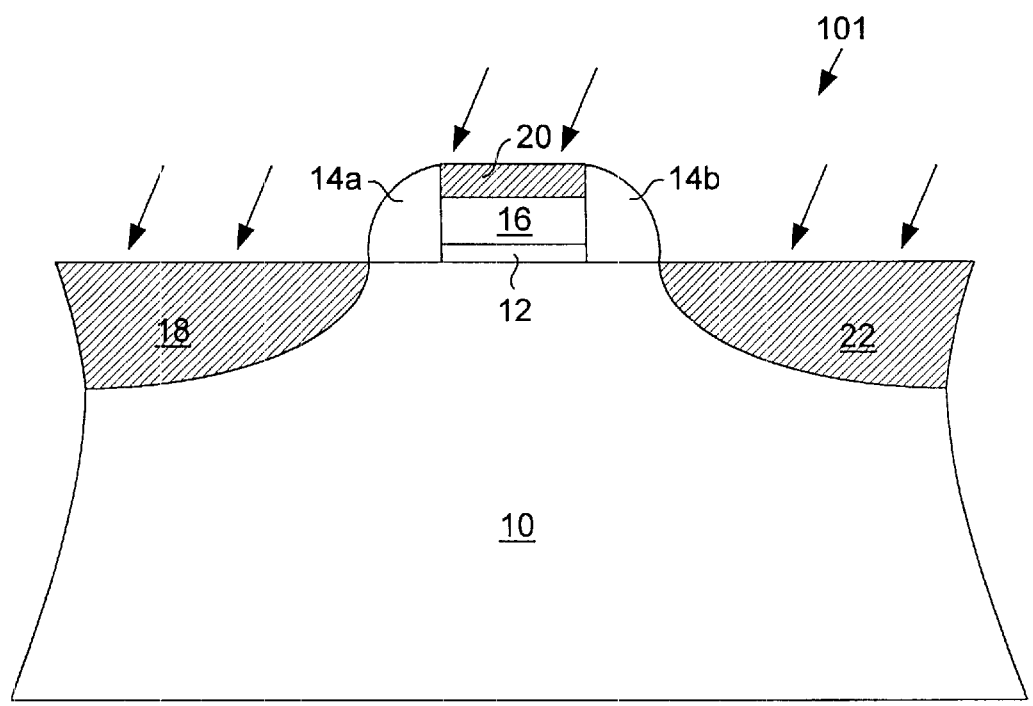
FIG. 9A is a cross sectional view of a partially fabricated transistor that is being implanted with N-type ions.
Figure 9B:
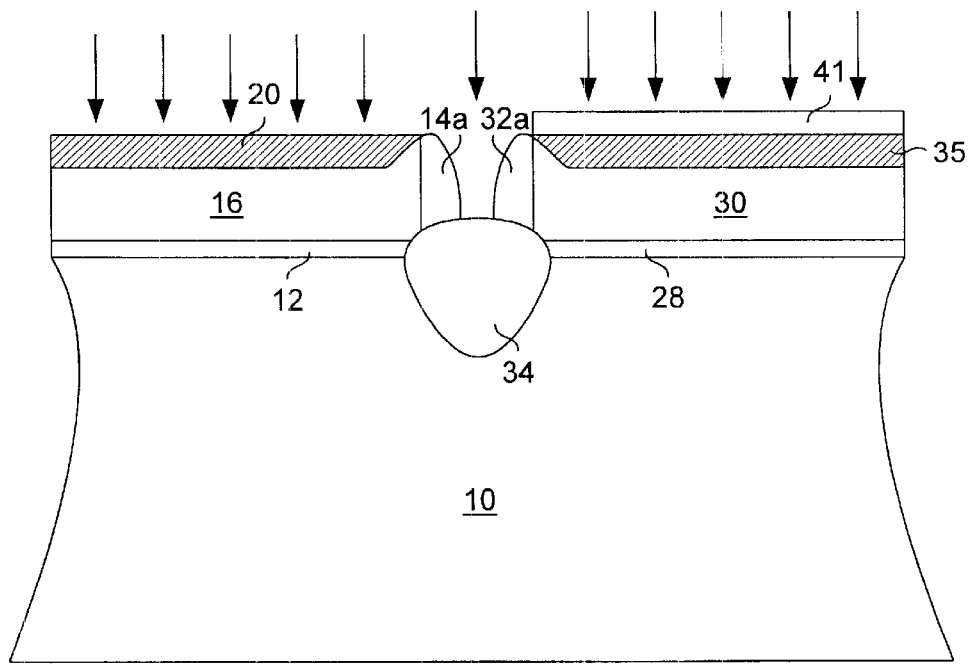
FIG. 9B is a cross sectional view across the channel regions of two adjacent, partially fabricated transistors where one transistor is being implanted with N-type ions.
Figure 9C:
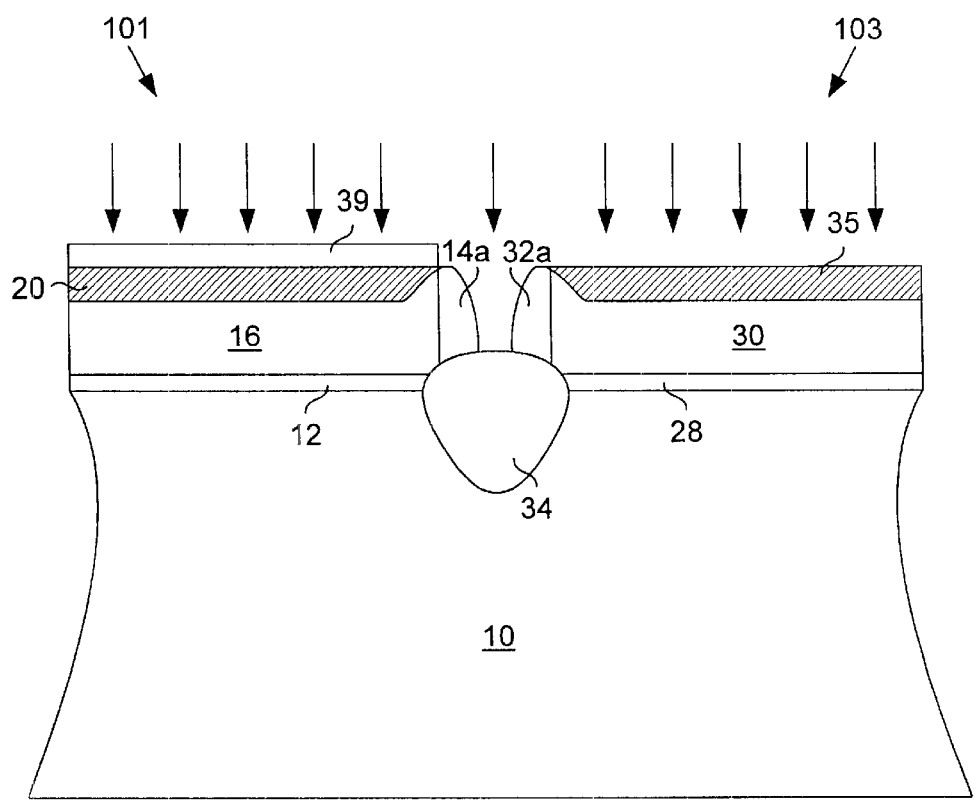
FIG. 9C is a cross sectional view across the channel regions of two adjacent, partially fabricated transistors where one transistor is being implanted with P-type ions.

FIG. 9A is a cross sectional view of the transistor of FIG. 8A during implantation of N-type ions in silicide regions 18, 20 and 22. FIG. 9B illustrates a cross sectional view across the channel regions of adjacent partially fabricated transistors 101 and 103 after masking of silicide layer 35 (as well as the remainder of device 103) followed by implantation of N-type ions in silicide regions 20, 18, and 22; thus device 101 is an NMOS transistor. Note that silicide layer 35 of transistor 103 on the right side of FIG. 9B is protected by mask layer 41 from implantation of N-type ions. FIG. 9C illustrates a cross sectional view of the channel regions across the two adjacent partially fabricated transistors depicted in FIG. 9B during a subsequent implantation of P-type ions in silicide layer 35. Silicide layer 20 is first protected with mask layer 39. Then mask layer 41 is selectively removed to provide unprotected silicide layer 35. Finally, P-type ions are implanted in silicide layer 35 that covers polysilicon gate electrode 30; thus device 103 is an PMOS transistor. One of skill in the art will recognize that the steps of implanting N-type ions and P-type ions can be inverted without affecting the scope of the instant invention.

A typical N-type dopant is arsenic or phosphorus. In one specific embodiment, arsenic implantation is typically done with arsenic ions at a dose of between about $10^{15}$ ions/cm$^2$ and about $5 \times 10^{15}$ ions/cm$^2$ (more preferably between about $3 \times 10^{15}$ ions/cm$^2$ and about $4 \times 10^{15}$ ions/cm$^2$) and at an energy of between about 50 keV and about 80 keV (more preferably between about 60 keV and about 70 keV). A typical P-type dopant is boron. Boron implantation is typically done with BF$_2^+$ at a dose of between about $10^{15}$ ions/cm$^2$ and about $5 \times 10^{15}$ ions/cm$^2$ (more preferably between about $3 \times 10^{15}$ ions/cm$^2$ and about $4 \times 10^{15}$ ions/cm$^2$) at an energy of between about 30 keV and about 50 keV (more preferably between about 40 keV and about 45 keV).

Figure 10A:
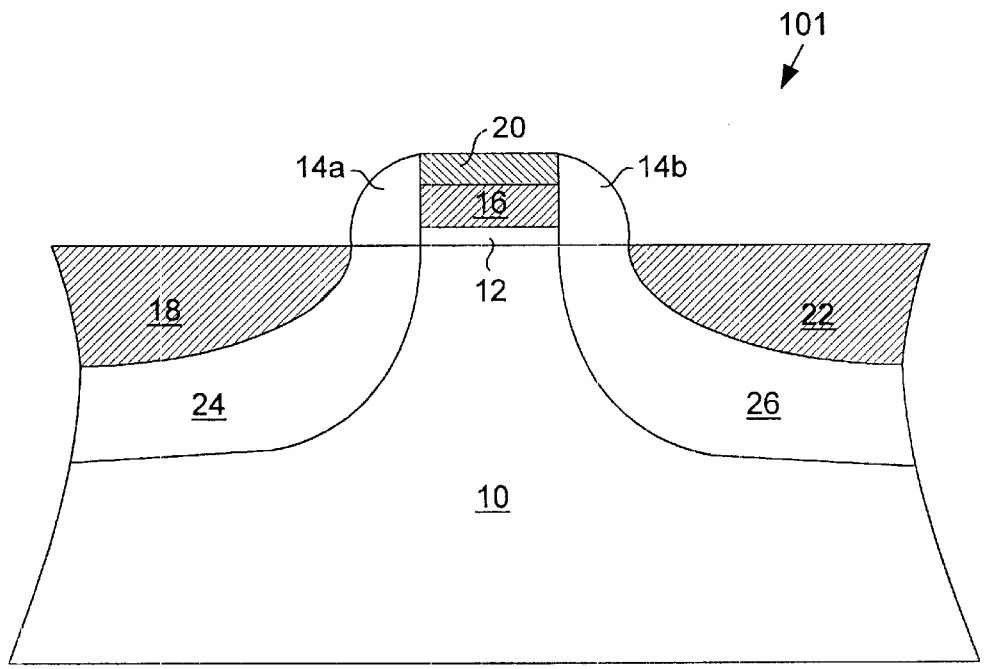
FIG. 10A is a cross sectional view of a partially fabricated N-type transistor after annealing to form source and drain diffusions.

FIG. 10A is a cross sectional view of transistor 101 after an annealing step that forms silicided shallow junctions and doped polysilicon gates simultaneously. Source 24 and drain 26 diffusions have been formed and dopant atoms have diffused from silicide layer 20 through the polysilicon gate electrode 16. Typically in 0.18 µm devices the depth of source and drain diffusion are typically about 1000 Å.

Figure 10B:
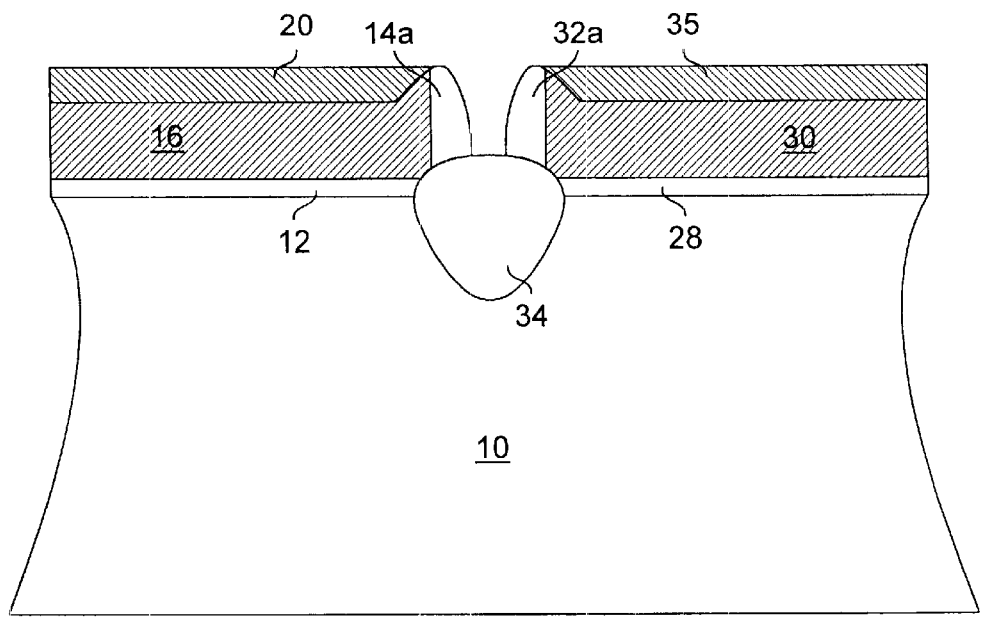
FIG. 10B is a cross sectional view across the channel regions of adjacent, partially fabricated N-type and P-type transistors after annealing to form source and drain diffusions.

FIG. 10B is a cross sectional view of the channel regions of adjacent partially fabricated transistors 101 and 103 after annealing. N-type dopant atoms have diffused from silicide layer 20 to polysilicon gate electrode 16. Similarly P-type dopant atoms have diffused from silicide layer 35 to polysilicon gate electrode 30. In a preferred embodiment, annealing is performed at between about 1100° C. and about 900° C. (more preferably between about 1000° C. and about 900° C.) for between about 60 seconds and about 10 seconds (more preferably between about 60 seconds and about 30 seconds) to form the diffusions of adjacent partially fabricated PMOS and NMOS transistors depicted in FIG. 10B.

Significantly, during the anneal step of the SADS process, P-type dopant atoms cannot diffuse from gate electrode 30 to gate electrode 16 because the adjacent devices are isolated by a trench. Similarly, N-type dopants cannot diffuse from gate electrode 16 to gate electrode 30. Thus, the combination of NMOS transistor 101 and the PMOS transistor 103 illustrated in FIG. 10B can effectively function as a CMOS circuit component (e.g., an inverter) after formation of a local interconnect because their polysilicon gate electrodes have not been contaminated by cross diffusion of electronically active dopants. One of skill in the art will recognize the arrangement of transistors depicted in FIG. 10B can be inverted without affecting the scope of the current invention.

At this point, the SADS process has been effectively completed. However, it is still necessary to electrically connect NMOS gate electrode 16 to PMOS gate electrode 30 to form, for example, an inverter. To this end, a local interconnection may be employed. FIGS. 11 through 16 depict steps that may be employed to form a local interconnection between the gate electrodes shown in FIG. 10B.

Figure 11:
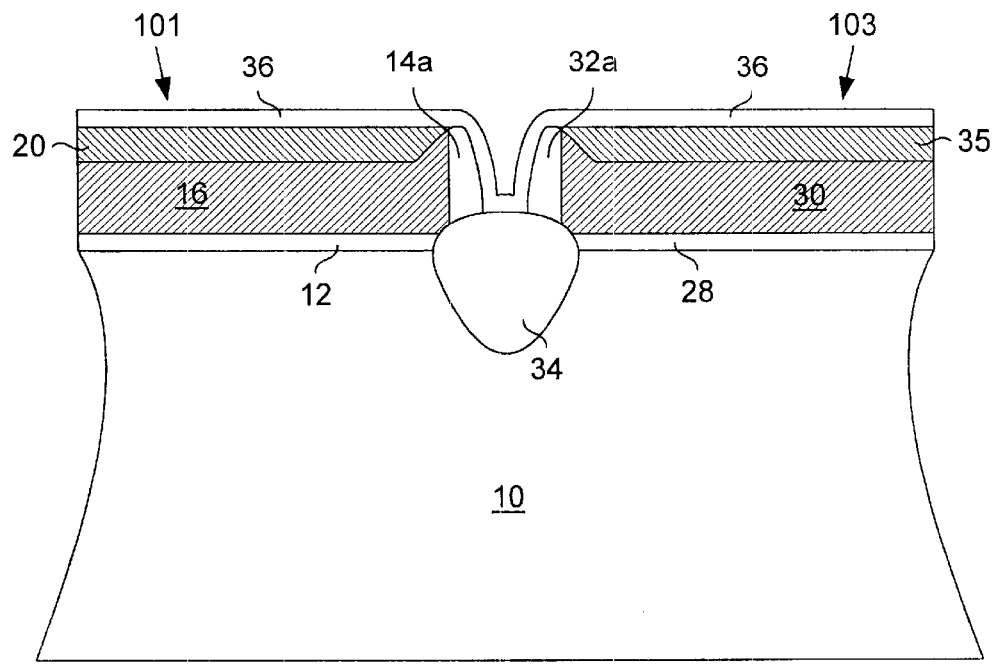
FIG. 11 is a cross sectional view of the channel regions of adjacent, partially fabricated N-type and P-type transistors after a silicon oxynitride layer is formed over the polysilicon.

FIG. 11 is a cross sectional view of the channel regions of the partially fabricated device of FIG. 10B after silicon oxynitride deposition. Silicon oxynitride layer 36 has been formed over silicide layer 20 and the polysilicon layer 35 of the gate electrode and is down to the shallow trench isolation region 34. Silicon oxynitride serves as an etch stopping layer for formation of the local interconnect and as a transistor passivation layer. Silicon oxynitride layer 36 may be deposited using conventional conditions to a thickness of between about 200 Å and about 500 Å (more preferably between about 300 Å and about 400 Å).

Figure 12:
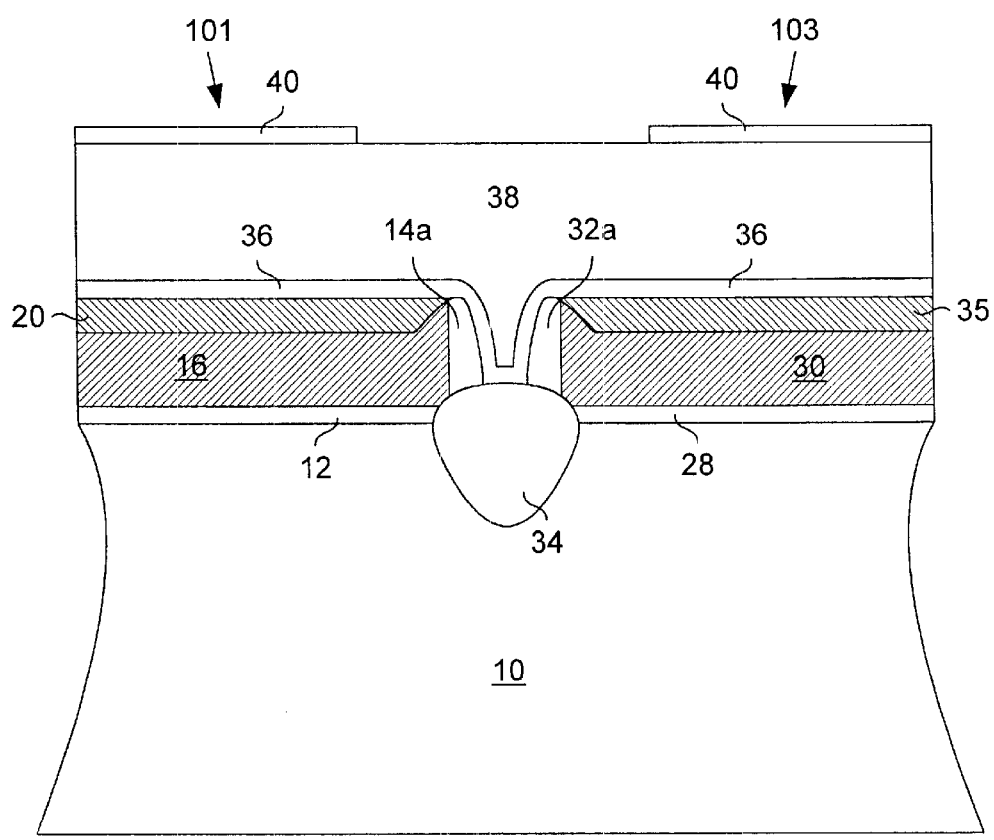
FIG. 12 is a cross sectional view of the channel regions of adjacent, partially fabricated N-type and P-type transistors after deposition of ILD layer over the silicon oxynitride layer followed by formation of a local interconnect contact mask over the ILD layer.

FIG. 12 is a cross sectional view of the channel regions of the partially fabricated device of FIG. 11 after deposition of a passivation layer 38 followed by formation of a contact mask 40 on top of the passivation layer. The passivation layer 38, which is sometimes referred to as an inter-layer dielectric ("ILD"), typically consists of an insulating material such as a borophosphosilicate glass and is deposited over silicon oxynitride layer 36. The contact mask is formed on top of ILD layer 38 to define contacts to transistor elements on the silicon substrate and the associated polysilicon gate electrodes. Conventional processing conditions, well known to those of skill in the art of semiconductor device fabrication may be used to deposit ILD layer 38 and form the contact mask 40.

Figure 13:
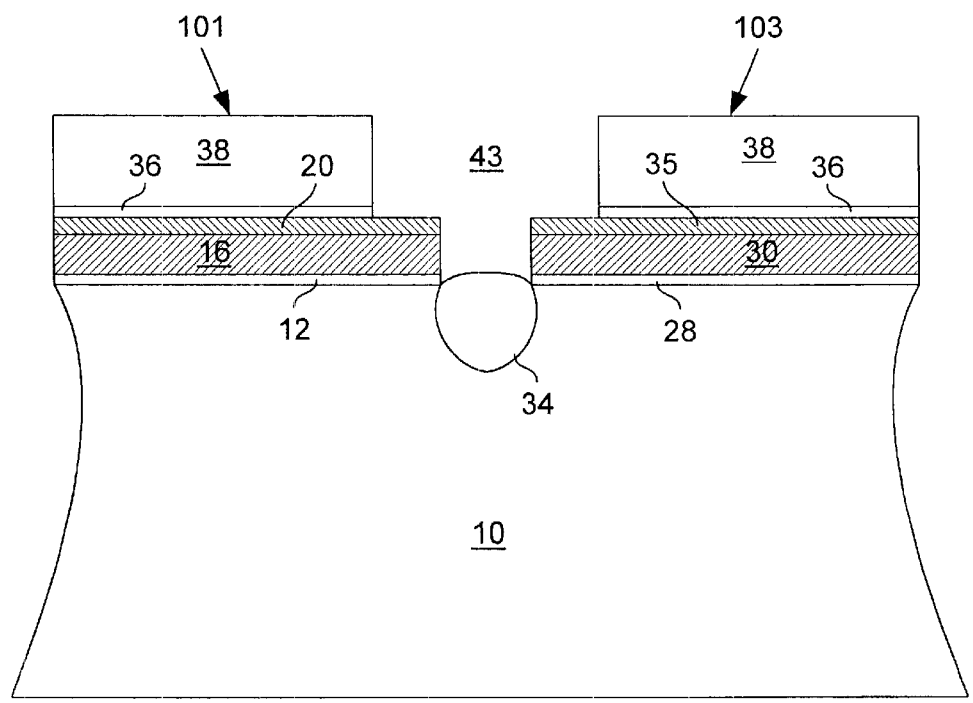
FIG. 13 is a cross sectional view of the channel regions of adjacent, partially fabricated N-type and P-type transistors after a contact hole for a local interconnect has been etched through the ILD layer to the silicon oxynitride layer and the etch mask has been removed.

FIG. 13 is a cross sectional view of the channel regions of the partially fabricated device of FIG. 12 after anisotropic etching of dielectric layer 38 (typically by a highly directional plasma etch) to form a contact hole 43 for the local interconnect. The contact hole 43 extends down to the silicon oxynitride layer 36 at the trench isolation region 34. Note that the anisotropic etch removes the edges of silicon oxynitride layer 36 as well as spacers 14a and 32a and exposes the edges of gate electrodes 16 and 30. After contact hole 43 has been formed the mask layer is removed by a conventional process to yield the partially fabricated semiconductor device depicted in FIG. 13.

At this point, the two gate electrodes 16 and 30 are still unconnected. Any number of conductive materials may be employed to form the local interconnect between these two structures. Such materials may include titanium nitride, tungsten, tantalum, tungsten-nickel, titanium, aluminum, copper, titanium silicide ($TiSi_2$), nickel silicide ($NiSi_2$) and combinations thereof.

Figure 14:
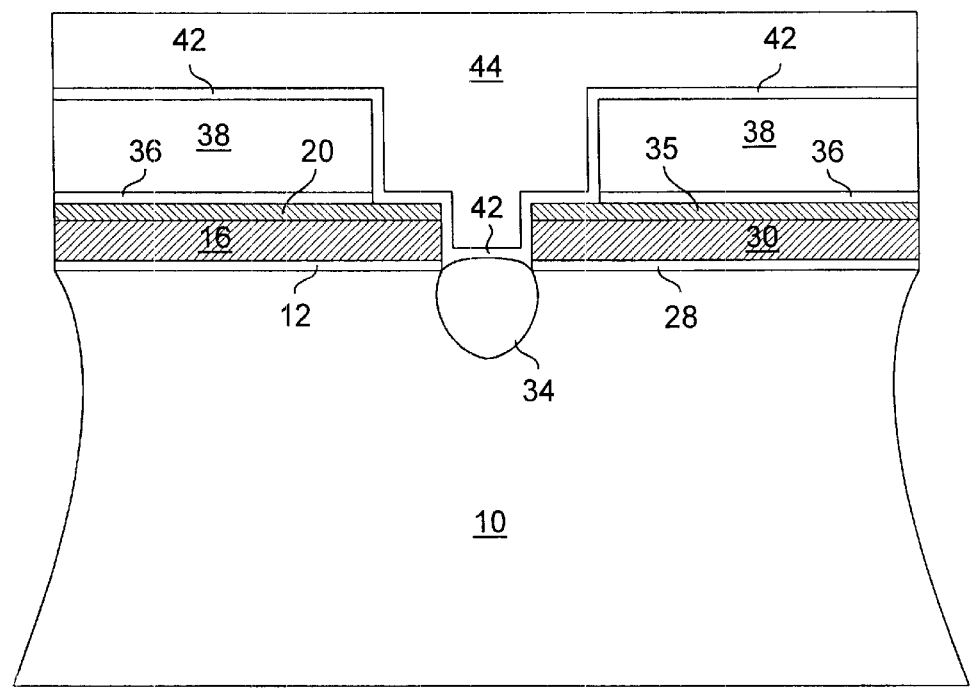
FIG. 14 is a cross sectional view of the channel regions of adjacent, partially fabricated N-type and P-type transistors after a titanium nitride layer has been conformally deposited in the contact hole and a tungsten metal layer has been deposited over the titanium nitride layer.

As will now be explained, a preferred local interconnect includes a conductive barrier layer and a metal plug. FIG. 14 is a cross sectional view of the channel regions of the device of FIG. 13 after conformal deposition of a barrier material and a metal into contact hole 43 to form a local interconnect. Initially, a titanium nitride layer 42 (the barrier layer) is deposited over the ILD layer 38. Importantly, titanium nitride layer 42 is conformally deposited in the contact hole at the trench isolation region 34. Significantly, titanium nitride layer 42 suffices to form a local interconnect between the adjacent NMOS and PMOS transistors since it is conductive. A layer of tungsten metal 44 is then deposited over the titanium nitride barrier layer 42 and typically completely fills the contact hole.

Figure 15:
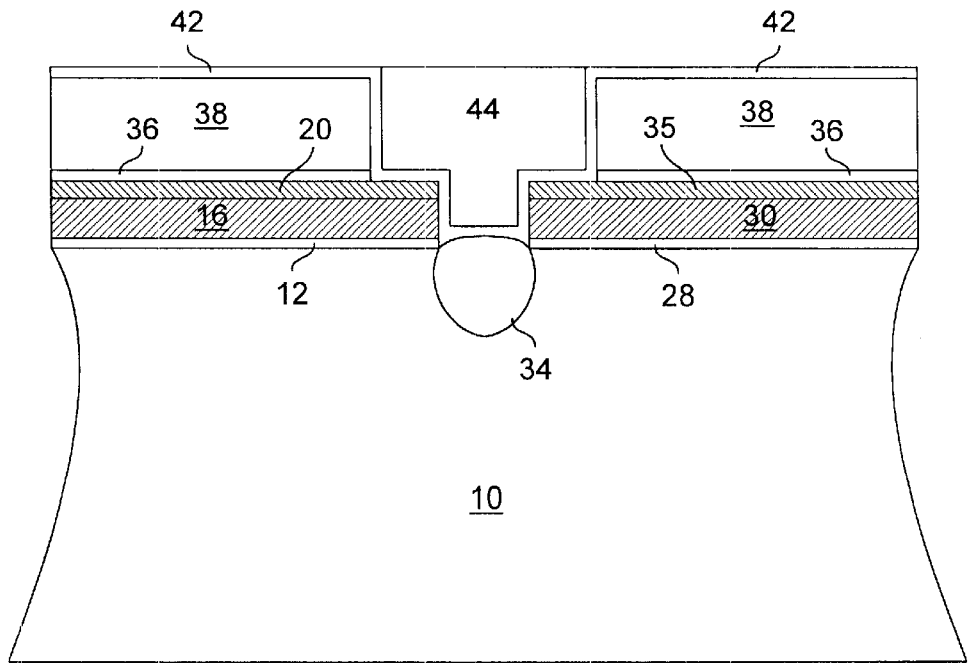
FIG. 15 is a cross sectional view of the channel regions of adjacent, partially fabricated N-type and P-type transistors after the tungsten layer has been planarized to the level of the titanium nitride layer to provide a local interconnect.

FIG. 15 is a cross sectional view of the channel regions of the device of FIG. 14 after planarization of the tungsten layer 44 to the level of titanium nitride layer 42. The remaining tungsten metal 44 completely fills the contact hole. The partially fabricated device depicted in FIG. 15 meets the requirements to form a local interconnect between adjacent polysilicon gate electrodes. Additional contacts to a first metallization layer are unnecessary to electrically interconnect gate electrodes of two adjacent transistors.

Figure 16:
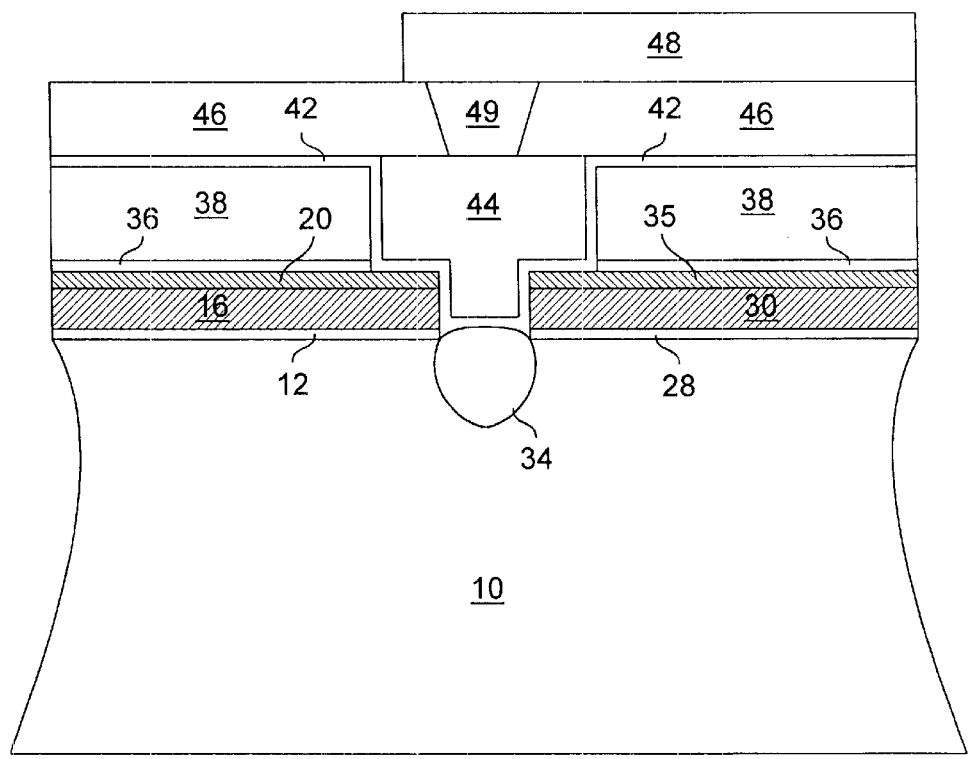
FIG. 16 is a cross sectional view of the channel regions of adjacent, partially fabricated N-type and P-type transistors which illustrates both the local interconnect and a conventional contact between the local interconnect and a first metallization layer.

FIG. 16 is a cross sectional view of the channel regions of a device which provides both a local interconnect between adjacent gate electrodes and a conventional contact between the local interconnect and a first metallization layer. The partially fabricated device of FIG. 15 has been augmented with a second ILD layer 46. ILD layer 46 has been etched to provide a vertical contact via. In some processes, the contact holes are filled with tungsten plugs according to procedures known in the art. A tungsten plug 49 is depicted in FIG. 16. Regardless of whether tungsten plugs are formed, a blanket deposition of a first metallization layer 48 is performed. The first metallization layer 48 may be made from various metals or alloys used in the industry such as aluminum (Al), aluminum copper (AlCu), or aluminum silicon copper (AlSiCu) or copper (Cu). These layers are conventionally deposited by sputtering, as is well known in the industry. Thus, either a tungsten plug or the metal used in the metallization layer fill the contact via in ILD layer 46 to provide the conventional contact between the local interconnect (layers) and first metallization layer 48.

After the conventional contact between the local interconnect and the first metallization layer has been formed, the device may be completed as follows. It should be understood that these steps are not critical to the invention and may be substituted with other suitable process steps known in the art.

The first metallization layer is then patterned to form lines connecting various device elements. The exact layout of the lines will be determined by the particular IC or ASIC design. The patterning is done by first depositing a mask such as a photoresist and then exposing it to light to define the pattern of metal lines to be created in a subsequent etch step. Thereafter, the underlying first metallization layer is etched by a plasma process such as reactive ion etching (RIE).

After the first metallization layer has been etched, the photoresist is removed and an inter-metal dielectric layer ("IMD") is deposited over the first metallization layer in order to insulate this metallization layer from the next successive metallization layer (i.e., the second metallization layer). Typically, oxide or phosphosilicate glass is used as the dielectric layer, but other dielectrics such as a nitride or polyimide films (which can be laid on by spinning) may also be used. The dielectric layer is then planarized by any appropriate technique. After a dielectric layer has been formed and planarized as described, a via mask is formed on the dielectric layer's upper surface. The via mask will define vias or regions where interconnects between the first and second metallization layers are to be formed. Thereafter, another plasma assisted etch is performed to create the actual vias in the dielectric layer. After the formation of the vias in the dielectric, the next metallization layer (metal-2) is deposited and patterned as described above. In some cases, it may be necessary to form and pattern one or more additional metallization layers to complete the wiring of the IC.

The local interconnect between two adjacent gate electrodes of complementary MOS transistors can be used in various circuit elements. However, local interconnects will be particularly useful in inverter circuits where an electrical connection must be made between a gate electrode of an N-type device and a gate electrode of a P-type device.

The instant invention could also be useful in a conventional process to eliminate a separate implant step for the gate electrodes. In conventional processes, polysilicon gate electrodes and source/drain regions are implanted with ions in different discrete steps to avoid cross diffusion of ions in polysilicon strips during the source drain anneal. In the instant invention cross diffusion is not possible. Therefore, polysilicon gate electrodes could already be doped when the source and drain diffusions are annealed.

CONCLUSION

While the invention has been described in some detail to facilitate understanding, it will be apparent that certain changes and modifications may be practiced within the scope of the appended claims. For example, while the specification has been limited to a formation of a specific local interconnect there is in principle no reason why many different types of local interconnects could not be employed. Although the formation of a local interconnect has been illustrated as being particularly useful in 0.18 $\mu$m devices and with respect to the SADS method the instant invention is not necessarily limited to small dimension transistors or a SADS process. For example as previously mentioned the instant invention could be used in a conventional process to eliminate a separate ion implantation step for the polysilicon gate electrodes. Therefore, the above described embodiments should be considered illustrative and not restrictive and the instant invention is not limited to the details given herein but may be modified within the scope of the appended claims.

What is claimed:

1. A method for forming a CMOS structure having a first transistor coupled to a second transistor by a common gate contact on a partially fabricated electronic device, the method comprising:

forming a first gate electrode on said first transistor and a second gate electrode on said second transistor;

providing dopant ions of a first conductivity to said first gate electrode and dopant ions of a second conductivity to said second gate electrode; and forming a local interconnection electrically connecting said first gate electrode and said second gate electrode, wherein the local interconnection extends below the first gate electrode and the second gate electrode, contacts a gate oxide layer beneath the first gate electrode and second gate electrode and retards diffusion of dopant atoms between the first and second gate electrodes.

2. The method of claim 1 further comprising:

annealing said CMOS structure, without diffusing dopant atoms between said first gate electrode and said second gate electrode during said annealing.

3. The method of claim 2 wherein annealing said CMOS structure is performed before forming said local interconnection.

4. The method of claim 2 wherein said annealing forms first source and drain diffusions in said first transistor and second source and drain diffusions in said second transistor.

5. The method of claim 1 wherein forming said first and second gate electrodes comprises patterning a polysilicon layer to provide said first and second gate electrodes such that said first gate electrode and said second gate electrode are unconnected polysilicon structures.

6. The method of claim 1 wherein said local interconnection includes titanium nitride.

7. The method of claim 1 wherein said local interconnection includes at least one of tungsten, titanium nitride, aluminum, copper, titanium silicide, tungsten-nickel, titanium, and nickel silicide.

8. The method of claim 1 wherein said local interconnection includes titanium nitride and tungsten.

9. The method of claim 1 wherein said first transistor is a NMOS transistor, said dopant ions of a first conductivity are N-type dopant ions, said second transistor is a PMOS transistor and said dopant ions of a second conductivity are P-type dopant ions.

10. The method of claim 9 wherein said dopant ions of a first conductivity are phosphorus or arsenic ions and said dopant ions of a second conductivity are boron.

11. A method for forming a CMOS structure on a partially fabricated electronic device, the method comprising:

(a) patterning a polysilicon layer to provide
a first gate electrode over a first transistor; and
a second gate electrode over a second transistor;

(b) forming
a first silicide layer over first source and drain regions of said first transistor; and
a second silicide layer over second source and drain regions of said second transistor;

(c) implanting dopant ions
of a first conductivity into said first silicide layer; and
of a second conductivity into said second silicide layer;

(d) annealing to provide
first source and drain diffusions that extend beyond said first silicide layer; and
second source and drain diffusions that extend beyond said second silicide layer without dopant ion diffusion between said first gate electrode and said second gate electrode; and (e) forming a local interconnection electrically connecting said first gate electrode and said second gate electrode below the first gate electrode and the second gate electrode, the local interconnection further electrically contacting a gate oxide layer which underlies both the first and second gate electrodes, which local interconnection retards diffusion of dopants between the first gate electrode and the second gate electrode.

12. The method of claim 11 wherein said source and drain diffusions are not more than about 0.1 $\mu$m thick.

13. The method of claim 11 wherein said silicide layers are not more than about 30 nm thick.

14. The method of claim 11 wherein said silicide layers include at least one of $CoSi_2$, $TiSi_2$, $NiSi_2$ and $WSi_2$.

15. The method of claim 11 wherein said gate electrodes include polysilicon.

16. The method of claim 11 wherein patterning the polysilicon layer comprises forming said first gate electrode such that it is unconnected to said second gate electrode, whereby said first gate electrode and said second gate electrode are unconnected polysilicon structures.

17. The method of claim 11 wherein said local interconnection includes titanium nitride.

18. The method of claim 11 wherein said local interconnection includes tungsten, titanium nitride, tungsten, aluminum, copper, titanium silicide, tungsten-nickel, titanium, and nickel silicide.

19. The method of claim 11 wherein said local interconnection includes titanium nitride and tungsten.

20. The method of claim 11 wherein said first transistor is a NMOS transistor, said dopant ions of a first conductivity are N-type dopant ions, said second transistor is a PMOS transistor and said dopant ions of a second conductivity are P-type dopant ions.

21. The method of claim 20 wherein said dopant ions of a first conductivity are phosphorus or arsenic and said dopant ions of a second conductivity are boron.

* * * * *